(12) United States Patent
Lee

(10) Patent No.: US 6,261,968 B1
(45) Date of Patent: Jul. 17, 2001

(54) METHOD OF FORMING A SELF-ALIGNED CONTACT HOLE ON A SEMICONDUCTOR WAFER

(75) Inventor: Tzung-Han Lee, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/497,669

(22) Filed: Feb. 4, 2000

(51) Int. Cl.$^7$ .................................................. H01L 21/302
(52) U.S. Cl. ........................ 438/734; 438/304; 438/305; 438/637; 438/279; 438/701; 438/696
(58) Field of Search .................................... 438/304, 305, 438/637, 279, 701, 702, 696, 723, 724, 719, 734

(56) References Cited

U.S. PATENT DOCUMENTS

| | | | |
|---|---|---|---|
| 5,554,557 | * | 9/1996 | Koh .......................................... 437/52 |
| 5,851,893 | * | 12/1998 | Gardner et al. ....................... 438/305 |
| 6,033,962 | * | 3/2000 | Jeng et al. ............................. 438/301 |
| 6,037,211 | * | 3/2000 | Jeng et al. ............................. 438/253 |
| 6,146,946 | * | 11/2000 | Wang et al. ........................... 438/264 |

* cited by examiner

*Primary Examiner*—Gregory Mills
*Assistant Examiner*—George Goudreau
(74) *Attorney, Agent, or Firm*—Winston Hsu

(57) ABSTRACT

The present invention provides a method of forming a self-aligned contact hole on a semiconductor wafer. The semiconductor wafer comprises a substrate, two gates positioned on the substrate, at least a doped area between the gates on the substrate and spacers on each of two opposite walls of each gate wherein the spacers between the gates are joined and cover the doped area. The method comprises forming a dielectric layer on the surface of the semiconductor wafer, the dielectric layer covering the gates and the spacers. A first etching process is performed to remove the dielectric layer above the doped area down to a predetermined depth to form an opening, the bottom of the opening comprising the spacers and an upper portion of the gates. Poly-silicon spacers are then formed on the interior walls of the opening, the poly-silicon spacers covering an upper portion of the spacers and the upper portion of the gates. A second etching process is performed to remove from between the poly-silicon spacers both the remaining dielectric layer and a lower portion of the spacers down to the surface of the doped area.

10 Claims, 8 Drawing Sheets

METHOD OF FORMING A SELF-ALIGNED CONTACT HOLE ON A SEMICONDUCTOR WAFER

BACKGROUND OF THE INVENTION

1. Field of the Invention

The present invention relates to a method of forming a self-aligned contact hole on a semiconductor wafer, and more particularly, to a method of forming a self-aligned contact hole of a DRAM (dynamic random access memory) on a semiconductor wafer.

2. Description of the Prior Art

In semiconductor fabrication, a contact hole is used to form an interconnect that electrically connects together devices of an integrated circuit. Generally speaking, a photolithographic and an etching process are performed on a semiconductor wafer to form a contact hole. However, as the line width of semiconductor designs shrinks, the size of the contact hole must also shrink. Current semiconductor fabrication techniques employ the differing etching selectivity of different materials in an etching process to form the self-aligned contact hole.

Please refer to FIG. 1 to FIG. 3. FIG. 1 to FIG. 3 are cross-sectional diagrams of forming a self-aligned contact hole 34 on a semiconductor wafer 10 according to the prior art. The semiconductor wafer 10 comprises a silicon substrate 12, two gates 24 positioned on the surface of the silicon substrate 12, a doped area 14 positioned between the gates 24 on the substrate 12 and a dielectric layer 28 of silicon oxide positioned on the silicon substrate 12. The dielectric layer 28 covers the gates 24. Each of the gates 24 comprises a gate oxide layer 16 of silicon oxide, a doped poly-silicon layer 18 and a silicide layer 20. Each gate 24 also comprises a silicon nitride spacer 26 on each of two opposite walls, and a silicon nitride cap layer 22 on the top surface of the gate 24.

According to the prior art, a spin coating process is performed to form a photoresist layer 30 on the dielectric layer 28, and a lithographic process is then performed to form a pattern 32 in the photoresist layer 30 to define the size and the position of the contact hole 34, as shown in FIG. 2. A dry etching process is performed, using the photoresist layer 30 as a hard mask, to remove the dielectric layer 28 under the pattern 30 down to the surface of the doped area 14. A photoresist stripping process is then performed to totally remove the photoresist layer 30 so as to form the contact hole 34, as shown in FIG. 3.

When performing a self-aligned contact hole etching according to the prior art, the etching selectivity difference between silicon oxide and silicon nitride is exploited to form the contact hole 34. The etching rate of the etching process is controlled to remove the silicon oxide dielectric layer 28 faster than the silicon nitride spacers 26 so as to remove only the dielectric layer 28 while keeping the spacers 26. However, as the line width of the semiconductor design shrinks, the height of gate 24 becomes relatively larger in comparison to the line width. In order to reduce the contact resistance between the doped area 14 and a subsequently formed conductive plug in the contact hole 34, the thickness of the spacers 26 is reduced so as to increase the contact area between the doped area 14 and the contact hole 34. During the dry etching process the spacers 26 are damaged, particularly at the junction of the spacers 26 and the cap layer 22, due to their extreme thinness.

The damage of the cap layer 22 and the spacers 26 affects the subsequent structure of the gates 24. For example, the distance between the gates 24 and the conductive material that is used to fill the contact hole 34 becomes too short. This causes short-circuiting and electrical leakage between the conductive material in the contact hole, the doped poly-silicon layer 18 and the silicide layer 20.

SUMMARY OF THE INVENTION

It is therefore a primary objective of the present invention to provide a method of forming a self-aligned contact hole on a semiconductor wafer that avoids the above-mentioned problems.

In a preferred embodiment, the present invention provides a method of forming a self-aligned contact hole on a semiconductor wafer. The semiconductor wafer comprises a substrate, two gates positioned on the substrate, at least a doped area between the gates on the substrate and spacers on each of two opposite walls of each gate, the method comprising:

forming a dielectric layer on the surface of the semiconductor wafer, the dielectric layer covering the gates and the spacers;

performing a first etching process to remove the dielectric layer above the doped area down to a predetermined depth to form an opening, the bottom of the opening comprising the spacers and an upper portion of the gates;

forming poly-silicon spacers on the interior walls of the opening, the poly-silicon spacers covering an upper portion of the spacers and the upper portion of the gates; and performing a second etching process to remove from between the poly-silicon spacers both the dielectric layer and a lower portion of the spacers down to the surface of the doped area so as to complete the self-aligned contact hole.

It is an advantage of the present invention that the etching process damage to the cap layer is effectively prevented by utilizing the high etching selectivity between poly-silicon and silicon nitride. Moreover, according to the present invention, it is not necessary to form spacers between the gates, simplifying the formation of the contact hole.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
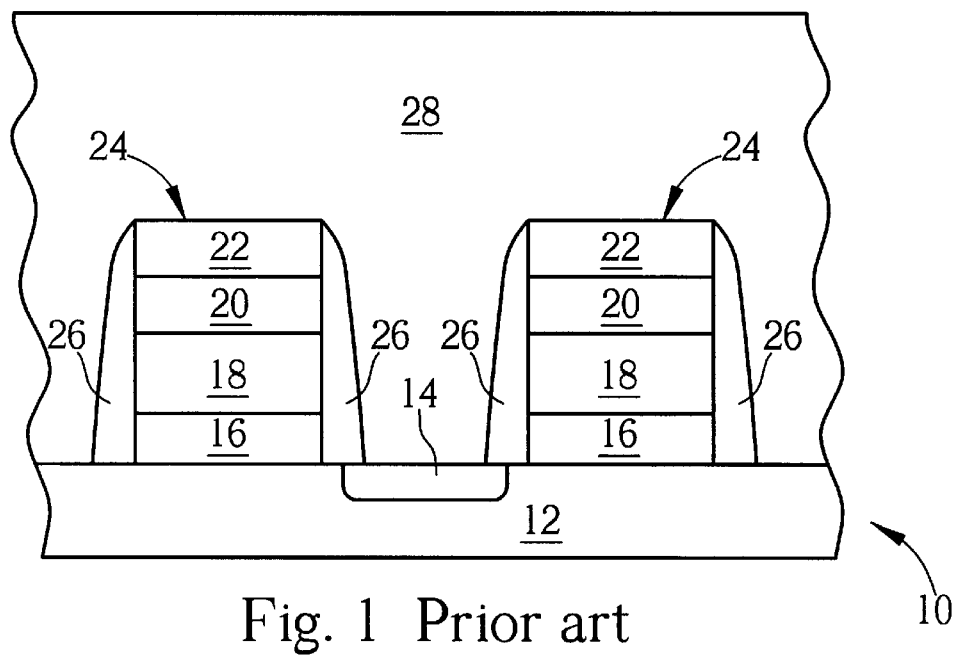
FIG. 1 to FIG. 3 are cross-sectional diagrams of forming a self-aligned contact hole according to the prior art.
Figure 2:
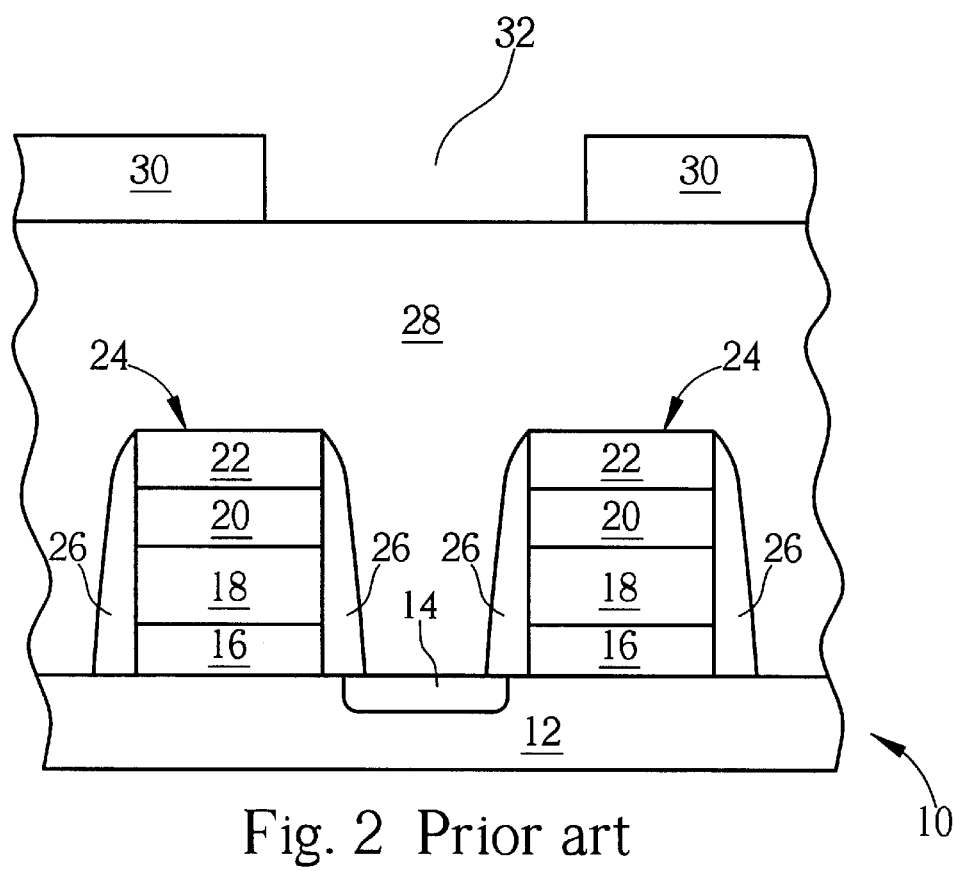
Figure 3:
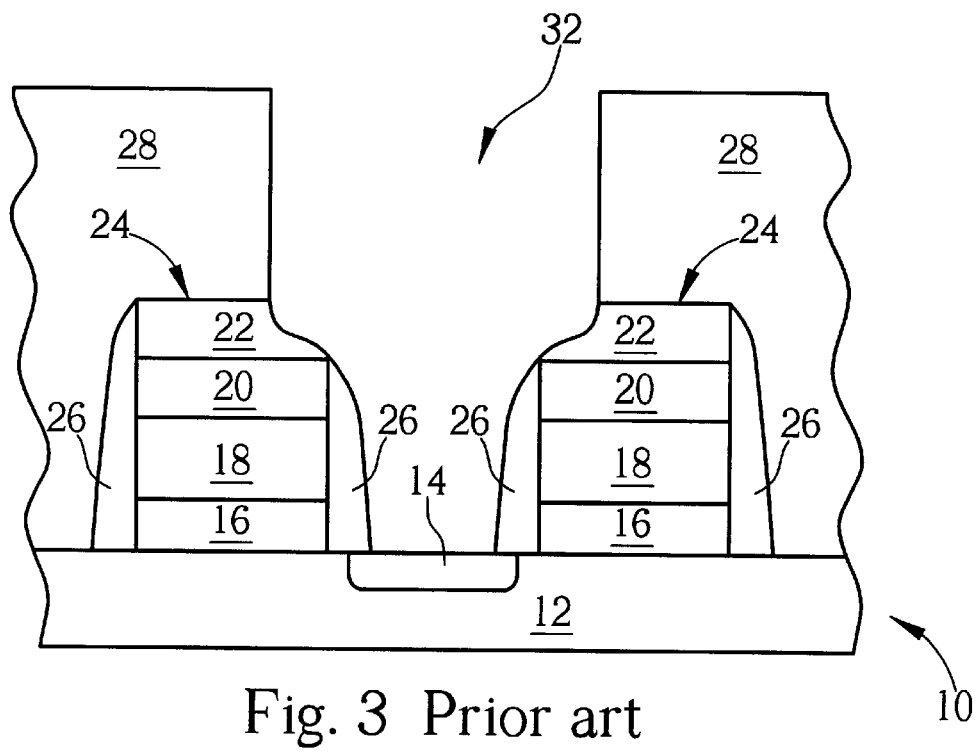
Figure 4:
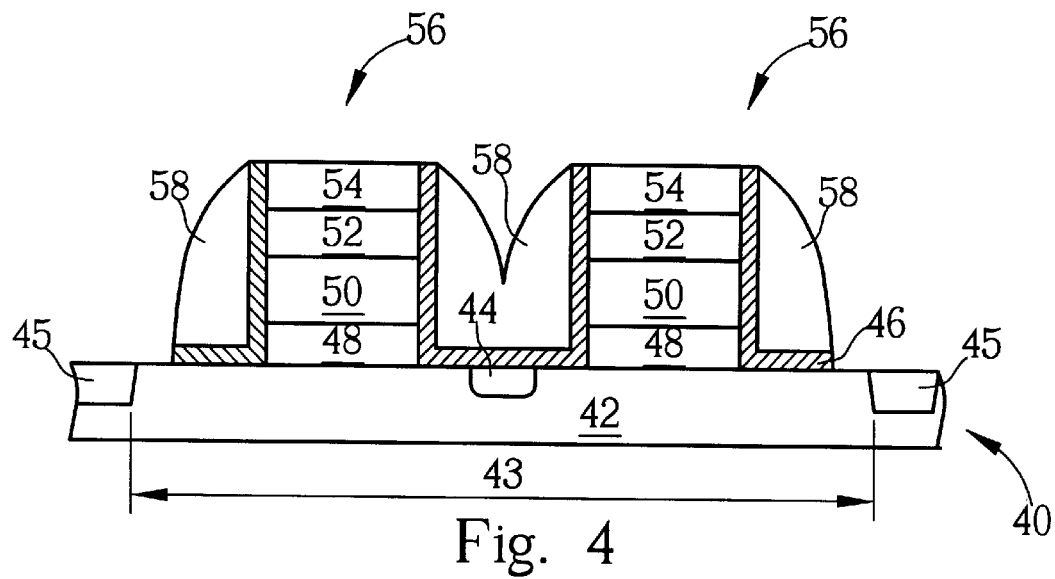
FIG. 4 to FIG. 9 are cross-sectional diagrams of forming a contact hole according to the present invention.

Please refer to FIG. 4 to FIG. 9. FIG. 4 to FIG. 9 are cross-sectional diagrams of forming a self-aligned contact hole 68 on a semiconductor wafer 40 according to the present invention. The semiconductor wafer 40 comprises a silicon substrate 42, an active area 43 positioned on a predetermined area of the substrate 42, a shallow trench isolation (STI) 45 positioned on the substrate 42 around the active area 43, two gates 56 positioned on the surface of the active area 43, a doped area 44 on the substrate 42 between the gates 56, spacers 58 on each of two opposite walls of each gate 56, and a silicon oxide layer 46 between the spacers 58 and the substrate 42 and between the spacers 58 and the gates 56 to reduce the thermal stress generated by the spacers 58. The spacers 58 are formed of either silicon oxide or silicon nitride.

As the design line width shrinks, it becomes increasingly difficult to form individual spacers 58 between the gates 56 wherein the spacers 58 are formed of either silicon oxide or silicon nitride. Hence, the spacers 58 between the gates 56 are joined together, covering the doped area 44. The STI is used to electrically isolate the active area 43 from other devices on the substrate 42. The STI can be replaced by field oxide (FOX) for a semiconductor fabrication process with a larger design rule. Each gate 56 comprises a gate oxide layer 48 positioned on a predetermined area of the substrate 42, a doped poly-silicon layer 50 positioned on the gate oxide layer 48, a silicide layer 52 positioned on the doped poly-silicon layer 50, and a silicon nitride layer 54 positioned on the silicide layer 52 serving as a cap layer.

Figure 5:
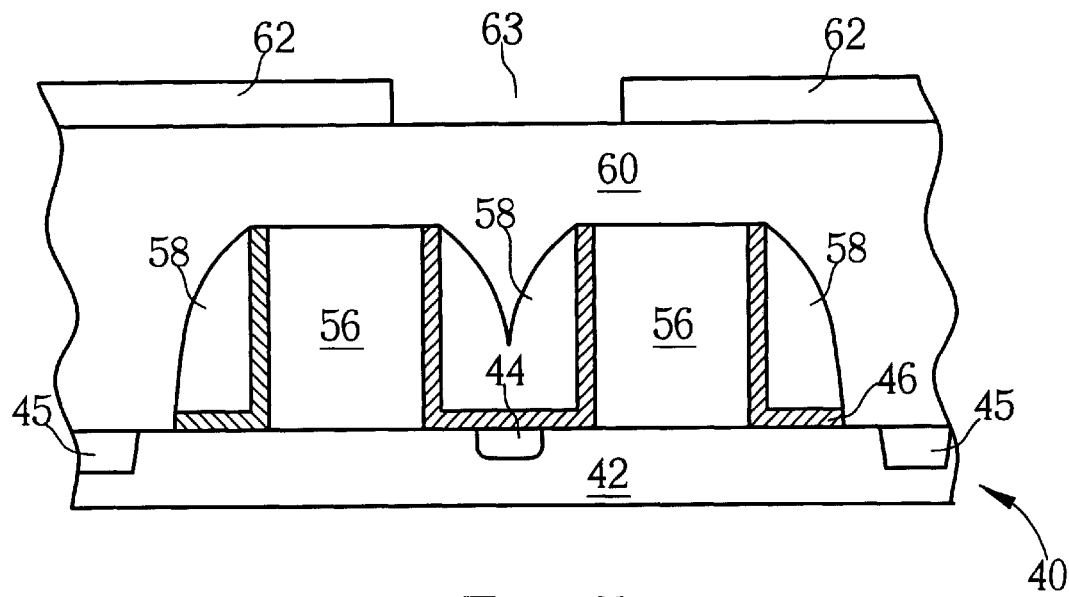
Figure 6:
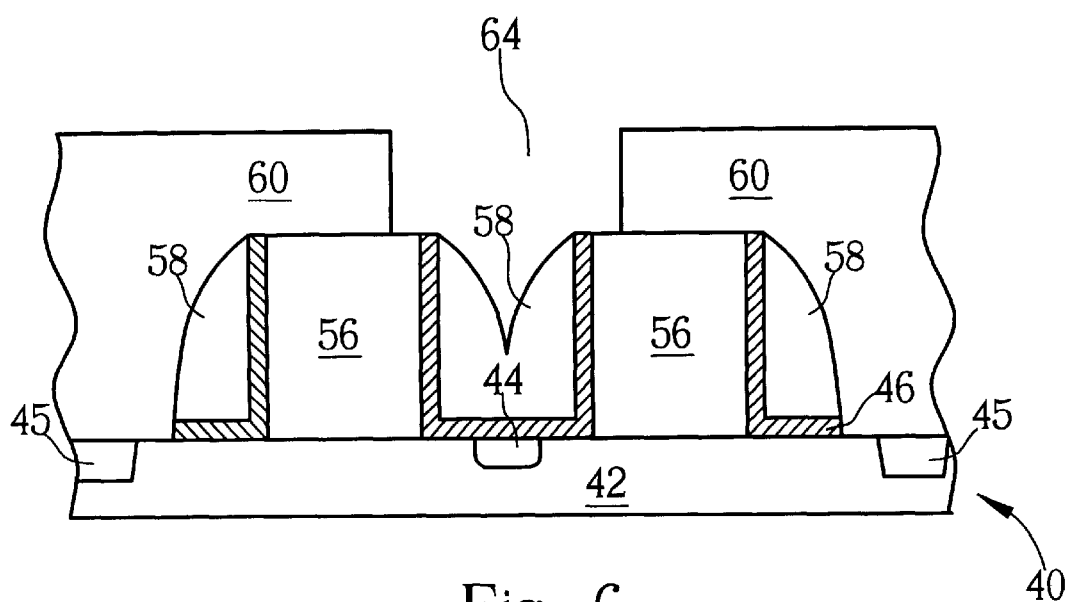

According to the present invention, an LPCVD process is performed to form a dielectric layer 60 on the surface of the semiconductor wafer 40. The dielectric layer 60 covers the gates 56 and the spacers 58. A spin-coating process is performed to form a photoresist layer 62 on the surface of the dielectric layer 60, and a lithographic process is then performed to form a pattern 63 in the photoresist layer 62, as shown in FIG. 5. A dry etching process is performed to remove the dielectric layer 60 above the doped area 44 down to a predetermined depth and a photoresist stripping process is then performed to totally remove the photoresist layer 62 to form an opening 64, as shown in FIG. 6. The bottom of the opening 64 comprises the spacers 58 and an upper portion of the gates 56. Additionally, portions of the dielectric layer 60 may remain at the bottom of the opening 64 after the dry etching process.

Figure 7:
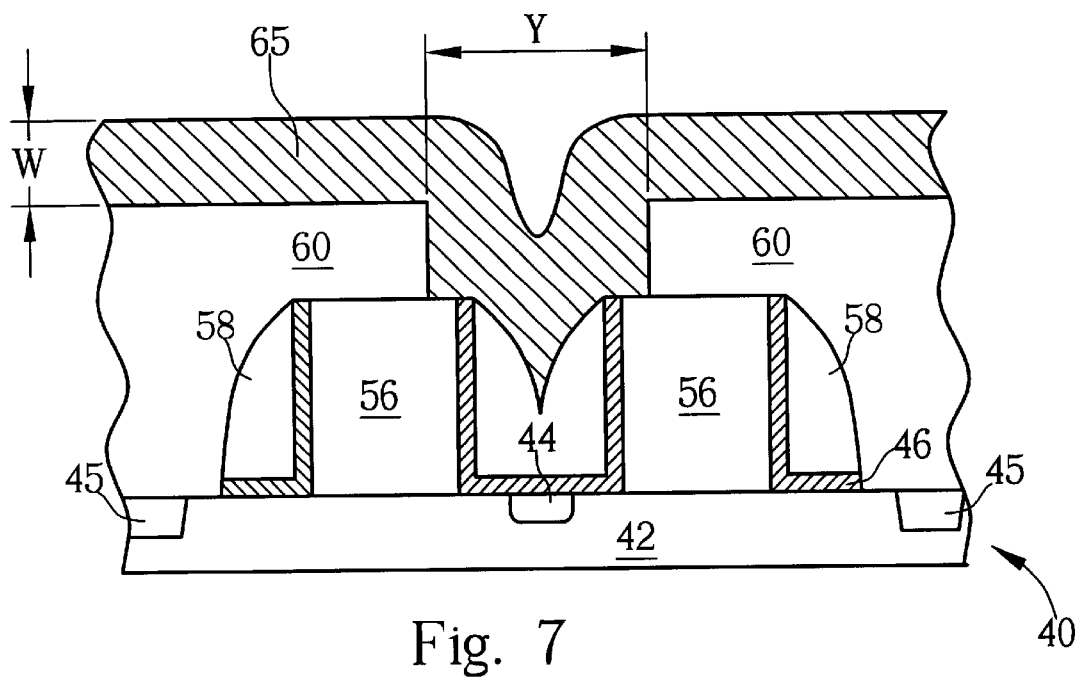
Figure 8:
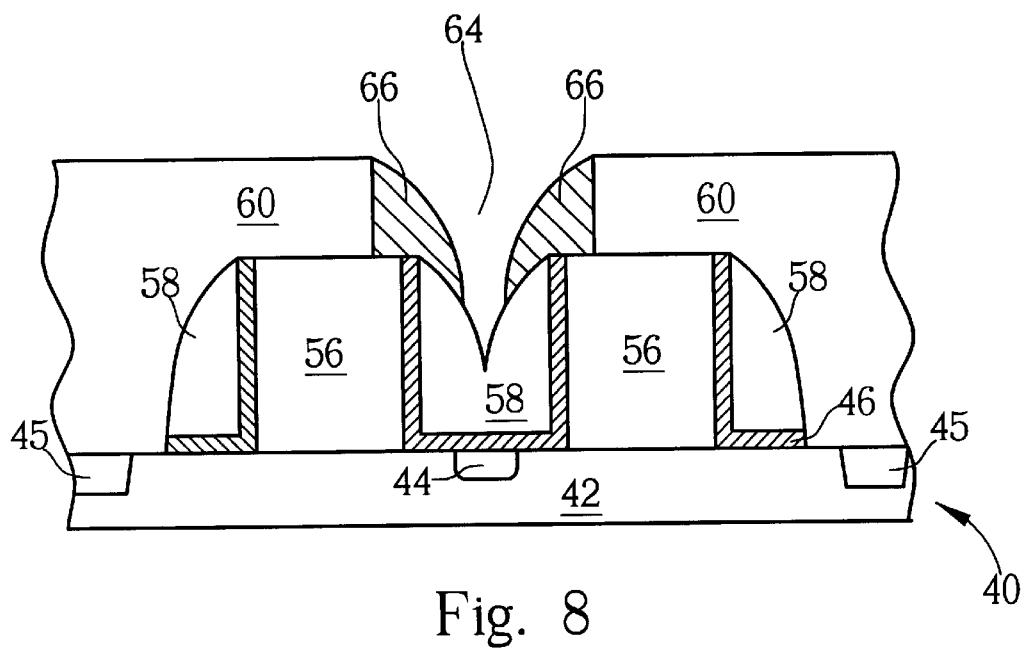

After the photoresist stripping process, another LPCVD process is performed to form a poly-silicon layer 65 that uniformly covers the surface of the dielectric layer 60, the interior walls of the opening 64, and the bottom surface of the opening 64, as shown in FIG. 7. A dry etching process is then performed to remove the poly-silicon layer 65 from the surface of the dielectric layer 60 and from the bottom surface of the opening 64. The remaining portions of the poly-silicon layer 65 form poly-silicon spacers 66 on the upper portion of the gates 56 and the upper portion of the spacers 58, as shown in FIG. 8. The reactive temperature of the LPCVD process is kept between 600 and 650(°C.), and the reactive pressure of the LPCVD is between 0.3 and 0.6 torr to avoid the formation of amorphous silicon. Moreover, the thickness (W) of the poly-silicon layer 65 must be less than half of the diameter (Y) of the opening 64, meaning that W<0.5Y (as shown in FIG. 7). These conditions are necessary so that the dry etching process can form the poly-silicon spacers 66 on the interior walls of the opening 64.

Figure 9:
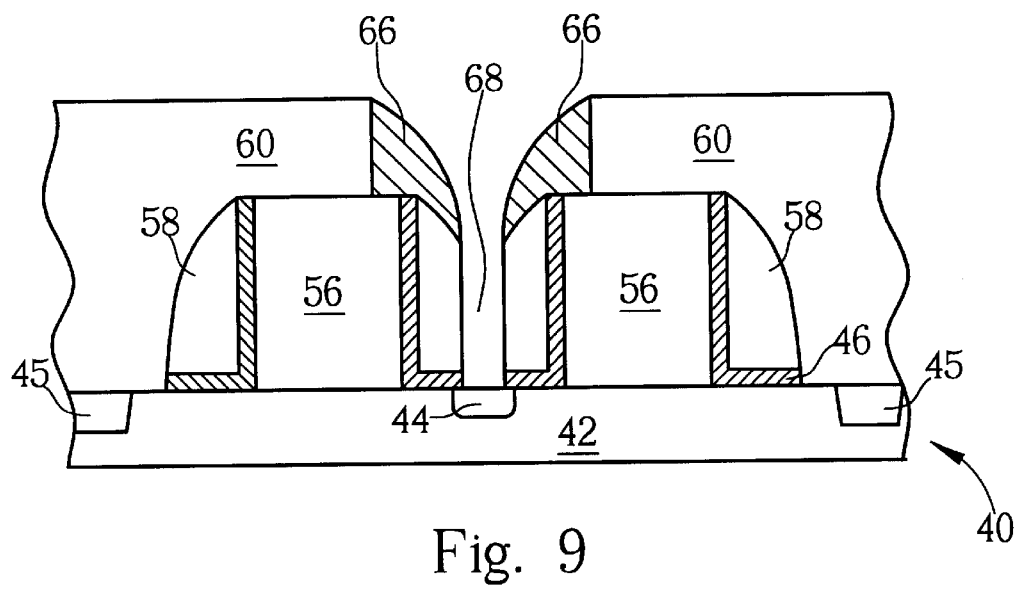

Finally, a dry etching process is performed to remove from between the poly-silicon spacers 66 both the remaining dielectric layer 60 (if any) and a lower portion of the spacers 58 down to the surface of the silicon oxide layer 46, as shown in FIG. 9. The etching selectivity of the dry etching process is then changed to remove the silicon oxide layer 46 down to the doped area 44 to form the self-aligned contact hole 68. Because portions of the interior wall of the contact hole 68 are formed of the insulating spacer 58 and spacers 66, the contact area between the doped area 44 and the bottom of the contact hole 68 is small. In order to reduce the resistance of a subsequently formed conductive plug in the contact hole 68, an ion implanting process is performed on the doped area 44 to reduce the contact resistance between the doped area 44 and the contact plug.

The present invention uses the high etching selectivity of the dry etching process between the poly-silicon spacers 66 and the silicon nitride spacers 58 to form the self-aligned contact hole 68. Damage to the cap layer 54 is thus effectively avoided during the dry etching process. Because the etching selectivity between poly-silicon and silicon nitride is better than that between silicon nitride and silicon oxide, the poly-silicon spacers 66 protect the cap layer 55 and the spacers 58 from excessive etching during the dry etching process. They also increase the electrical isolation between the gates 56 and the subsequent conductive plug.

Unlike the prior art, which uses the thickness of the spacers 26 between the gates 24 to define the contact area between the doped area 14 and the contact hole 34, the present invention uses the poly-silicon spacers 66 to define the contact area between the doped area 44 and the contact hole 68. The contact area will determine the contact resistance between the doped area 44 and the conductive plug formed in the contact hole 68, and so the present invention consequently controls contact resistance through the poly-silicon spacers 66. Because the thickness of the spacers 58 between the gates 56 does not affect the contact area, the spacers 58 between the gates 56 can be joined together to cover the doped area 44. In fact, with the present invention, the etching process required to form the spacers 58 can be neglected, and only the silicon nitride deposition process need be performed.

Figure 10:
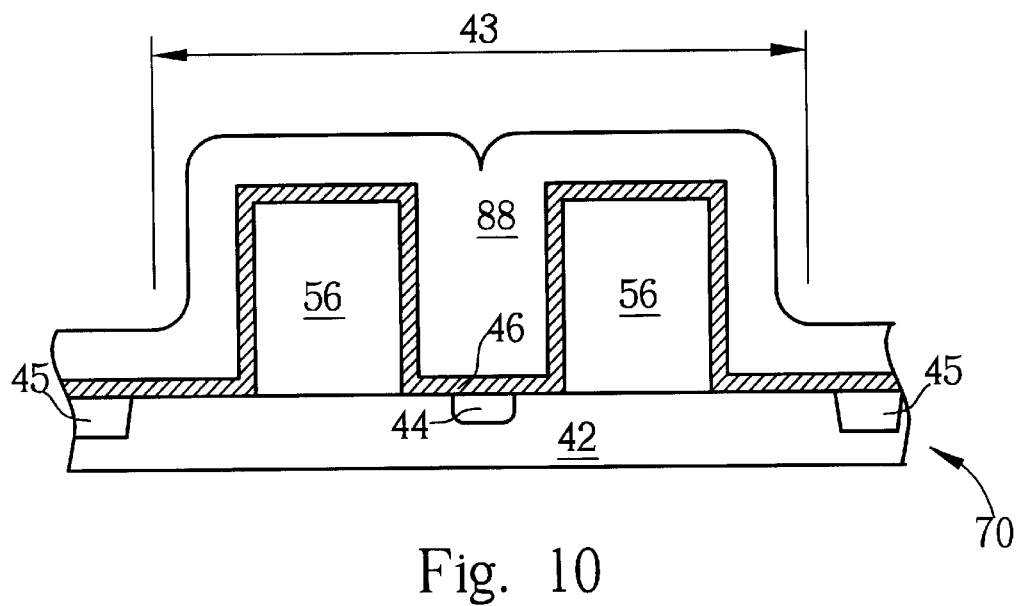
FIG. 10 to FIG. 15 are cross-sectional diagrams of another embodiment according to the present invention.
Figure 11:
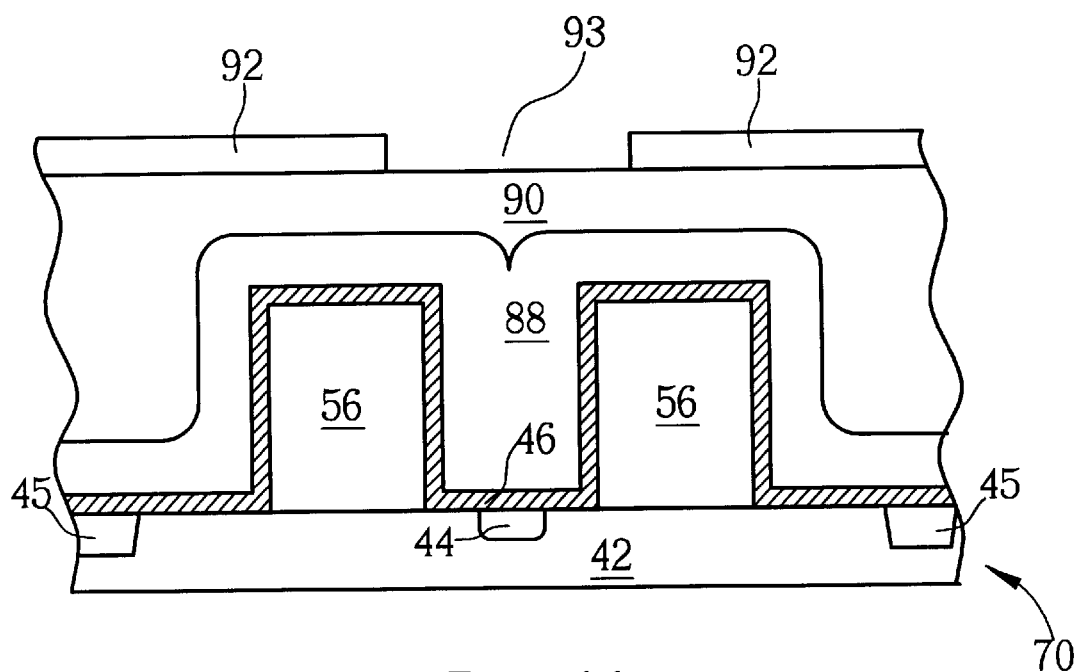
Figure 12:
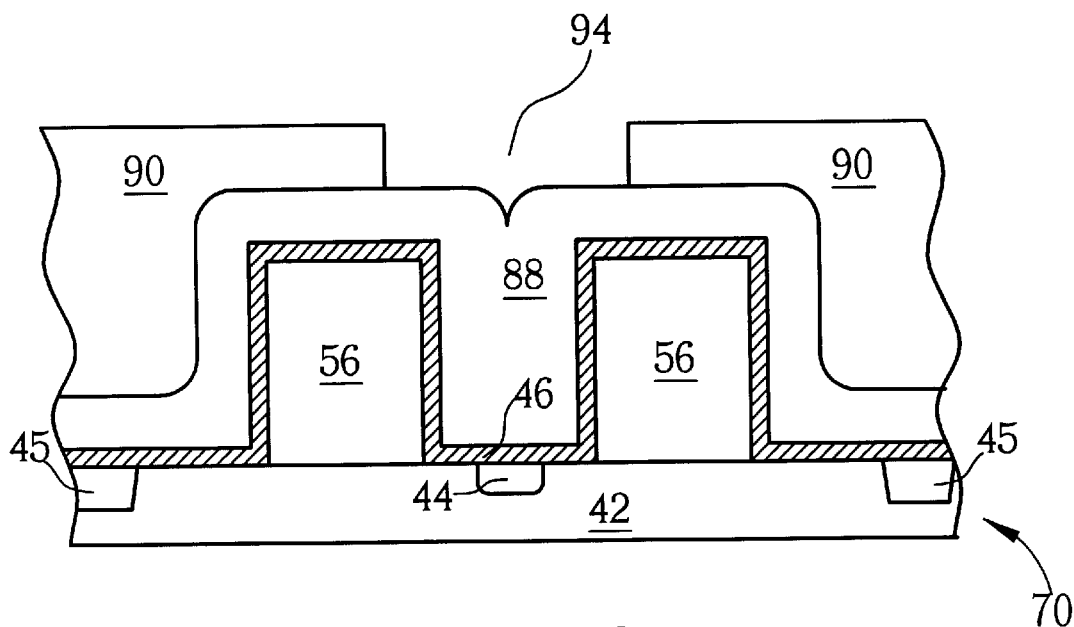

Please refer to FIG. 10 to FIG. 15. FIG. 10 to FIG. 15 are cross-sectional diagrams of another embodiment of forming a contact hole 98 on a semiconductor wafer 70 according to the present invention. The spacers 58 of the above embodiment are replaced by a silicon nitride layer 88 positioned on the surface of the semiconductor wafer and covering the gates 56, as shown in FIG. 10. According to the present invention, an LPCVD process is performed to form a dielectric layer 90 on the surface of the semiconductor wafer 70, the dielectric layer 90 covering the silicon nitride layer 88. A spin-coating process is performed to form a photoresist layer 92 on the surface of the dielectric layer 90, and a lithographic process is then performed to form a pattern 93 in the photoresist layer 92, as shown in FIG. 11. A dry etching process is performed to remove the dielectric layer 90 above the doped area 44 down to a predetermined depth, and a photoresist stripping process is then performed to totally remove the photoresist layer 92. The dry etching process forms an opening 94, as shown in FIG. 12. The bottom of the opening 94 comprises a portion of the silicon nitride layer above the gates 56 and portions of the dielectric layer 90 may also remain at the bottom of the opening 94 after the dry etching process.

Figure 13:
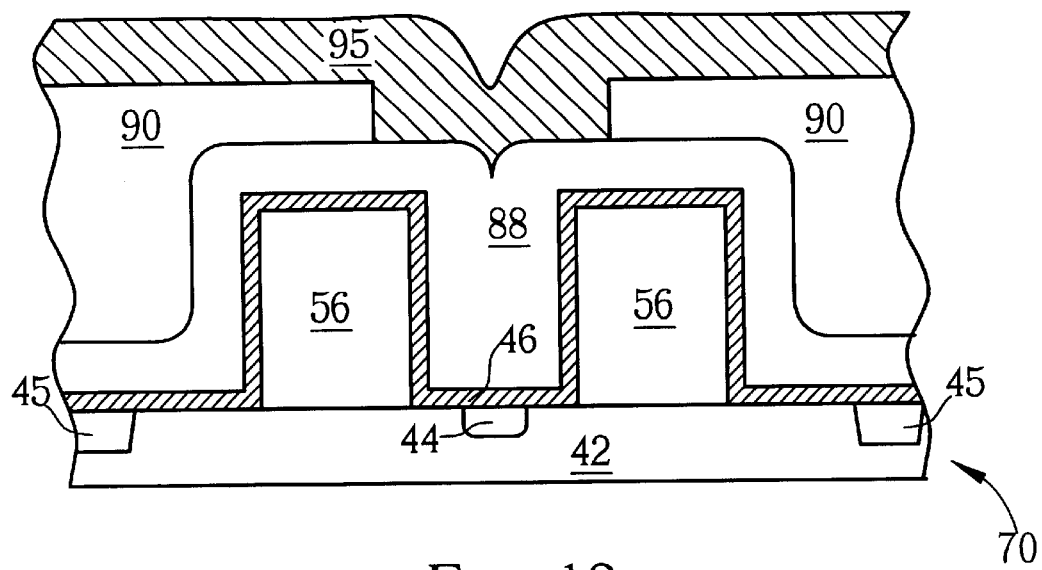
Figure 14:
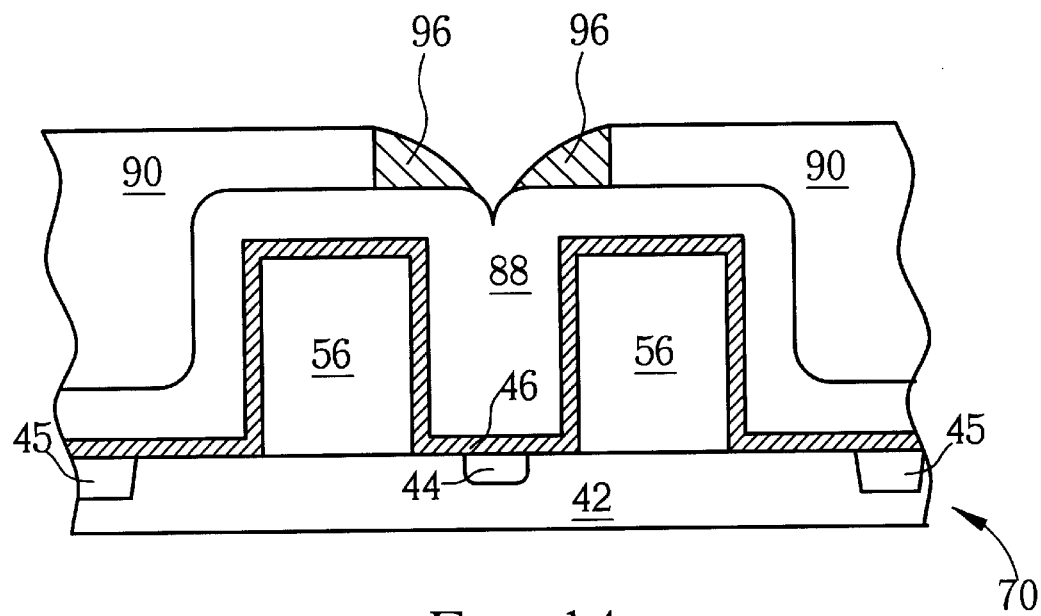
Figure 15:
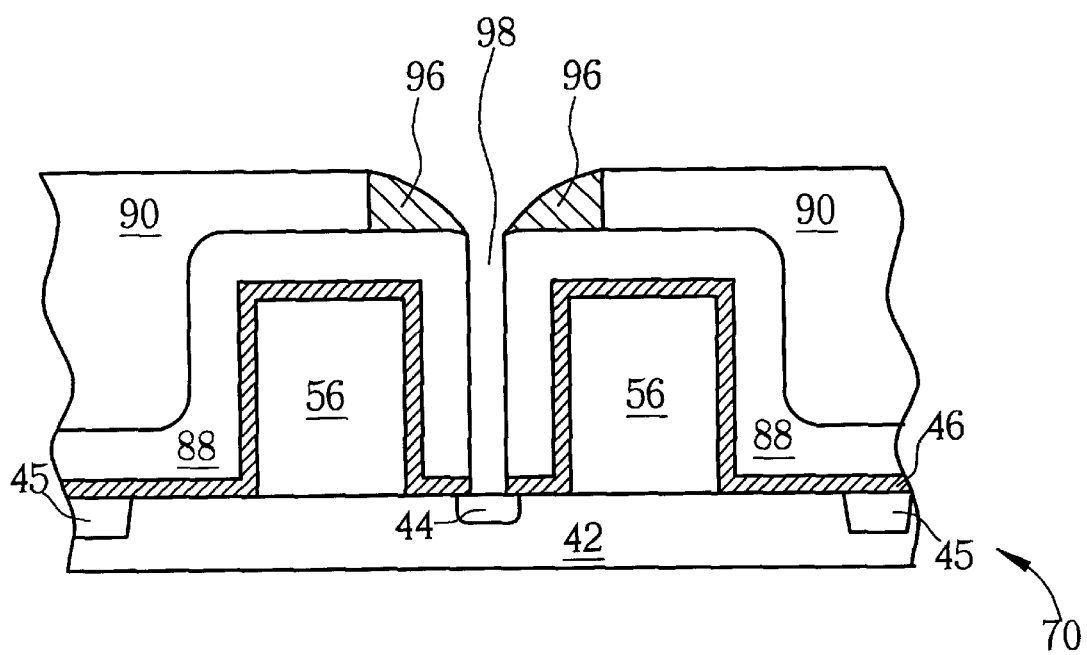

After the photoresist stripping process, another LPCVD process is performed to form a poly-silicon layer 95 that uniformly covers the surface of the dielectric layer 90, the interior walls of the opening 94, and the bottom surface of the opening 94, as shown in FIG. 13. A dry etching process is then performed to remove the poly-silicon layer 95 from the surface of the dielectric layer 90 and from the bottom surface of the opening 94. The remaining portions of the poly-silicon layer 95 form poly-silicon spacers 96 on that portion of the silicon nitride layer 88 that lies above the gates 56, as shown in FIG. 14. Finally, a dry etching process is performed to remove from between the poly-silicon spacers 96 both the remaining dielectric layer 90 (if any) and the silicon nitride layer 88 down to the surface of the silicon oxide layer 46, as shown in FIG. 15. The etching selectivity of the dry etching process is then changed to remove the silicon oxide layer 46 down to the doped area 44 to form the self-aligned contact hole 98.

As the line width of semiconductor designs shrinks, the spacers 58 formed between the gates 56 further reduce the contact area between the contact hole 68 and the doped area 44 (FIG. 9). In the present invention method of forming a contact hole 98, the spacers 58 are replaced by the silicon nitride layer 88, which serves as a cap layer for the gates 56. The present invention poly-silicon spacers 96 protect the silicon nitride layer 88 from over-etching during the dry etching process, and increase the electrical isolation between the gates 56 and a subsequently formed conductive plug in the contact hole 98.

Compared to the prior art method of forming a self-aligned contact hole 34, the present invention uses the high etching selectivity between poly-silicon and silicon nitride during the dry etching process to form the self-aligned contact hole. The cap layer 54 on the gates 56 is protected during the dry etching process and the structure of the gates 56 is guaranteed. Additionally, the present invention protects the silicon nitride layer 88 from over-etching and increases the electrical isolation between the gates 56 and a subsequently formed conductive plug in the contact hole 98. Moreover, according to the present invention, it is not necessary to form spacers between the gates, which simplifies the formation of the contact hole.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a self-aligned contact hole on a semiconductor wafer, the semiconductor wafer comprising:
    a substrate;
    two gates positioned on the substrate;
    at least a doped area between the gates on the substrate; and
    spacers on each of two opposite walls of each gate, the spacers between the gates being joined and covering the doped area;
    the method comprising:
        forming a dielectric layer on the surface of the semiconductor wafer, the dielectric layer covering the gates and the spacers;
        performing a first etching process to remove the dielectric layer above the doped area down to a predetermined depth to form an opening, the bottom of the opening comprising the spacers and an upper portion of the gates;
        forming poly-silicon spacers on the interior walls of the opening, the poly-silicon spacers covering an upper portion of the spacers and the upper portion of the gates; and
        performing a second etching process to remove from between the poly-silicon spacers both the dielectric layer and a lower portion of the spacers down to the surface of the doped area so as to complete the self-aligned contact hole.

2. The method of claim 1 wherein each of the gates comprises:
    a gate oxide layer positioned on a predetermined area of the substrate;
    a doped poly-silicon layer positioned on the gate oxide layer;
    a silicide layer positioned on the doped poly-silicon layer; and
    a silicon nitride layer positioned on the silicide layer, the silicon nitride layer serving as a cap layer.

3. The method of claim 1 wherein the spacers are made of silicon oxide.

4. The method of claim 1 wherein the spacers are made of silicon nitride and the semiconductor wafer further comprises a silicon oxide layer between the spacers and the gates, and between the spacers and the substrate to reduce thermal stress generated by the silicon nitride spacers.

5. The method of claim 1 wherein the method of forming the poly-silicon spacers comprises the following steps:
    forming a poly-silicon layer that uniformly covers the surface of the dielectric layer, the interior walls of the opening, and the bottom surface of the opening; and
    performing a dry etching process to remove the poly-silicon layer from the surface of the dielectric layer and from the bottom surface of the opening, the remaining portions of the poly-silicon layer forming the poly-silicon spacers on the upper portion of the gates and the upper portion of the spacers.

6. A method of forming a self-aligned contact hole on a semiconductor wafer, the semiconductor wafer comprising:
    a substrate;
    at least an active area positioned on a predetermined area of the substrate;
    two gates positioned on the surface of the active area; a doped area between the gates on the substrate; and
    a silicon nitride layer positioned on the surface of the semiconductor wafer and covering the gates;
    the method comprising:
        forming a dielectric layer on the surface of the semiconductor wafer, the dielectric layer covering the silicon nitride layer;
        performing a first etching process to remove the dielectric layer above the doped area down to a predetermined depth to form an opening, the bottom of the opening comprising a portion of the silicon nitride layer above the gates;
        forming poly-silicon spacers on the interior walls of the opening, the poly-silicon spacers covering the portion of the silicon nitride layer above the gates; and
        performing a second etching process to remove from between the poly-silicon spacers both the dielectric layer and the silicon nitride layer down to the surface of the doped area so as to complete the self-aligned contact hole.

7. The method of claim 6 wherein each gate comprises:
    a gate oxide layer positioned on a predetermined area of the substrate;
    a doped poly-silicon layer positioned on the gate oxide;
    a silicide layer positioned on the doped poly-silicon layer; and
    a silicon nitride layer positioned on the silicide layer, the silicon nitride layer serving as a cap layer.

8. The method of claim 6 wherein the semiconductor wafer further comprises a silicon oxide layer positioned on the surface of the semiconductor wafer under the silicon nitride layer and covering the gates, the silicon oxide layer being used to reduce the thermal stress generated by the silicon nitride layer.

9. The method of claim 6 wherein the method of forming the poly-silicon spacers comprises the following steps:
    forming a poly-silicon layer that uniformly covers the surface of the dielectric layer, the interior walls of the opening, and the bottom surface of the opening; and performing a dry etching process to remove the poly-silicon layer from the surface of the dielectric layer and from the bottom surface of the opening, the remaining portions of the poly-silicon layer forming the poly-silicon spacers on the portion of the silicon nitride layer above the gates.

10. The method of claim 6 wherein the semiconductor wafer further comprises field oxide (FOX) or shallow trench isolation (STI) positioned on the surface of the substrate around the active area.

* * * * *